United States Patent [19]

Corlay et al.

[11] Patent Number: 5,372,293
[45] Date of Patent: Dec. 13, 1994

[54] APPARATUS FOR DEGOLDING OR TINNING CONDUCTIVE PORTIONS OF A MICROELECTRONIC DEVICE

[75] Inventors: Christian Corlay, Saint-Germain-en Laye; Jean-Claude Germain, Gif-sur-Yvette; Claude Chevalier, Saint-Germain-en Laye, all of France

[73] Assignee: Carrar, Saint-Germain-en-Laye, France

[21] Appl. No.: 155,762

[22] Filed: Nov. 23, 1993

Related U.S. Application Data

[62] Division of Ser. No. 980,160, Nov. 23, 1992, Pat. No. 5,288,009.

[51] Int. Cl.$^5$ ................................................. B23K 3/06
[52] U.S. Cl. ...................................... 228/56.1; 228/36; 118/423; 118/429
[58] Field of Search ............... 228/36, 40, 56.1, 180.1, 228/56.2, 38, 102; 427/430.1, 431; 118/421, 422, 423, 429

[56] References Cited

U.S. PATENT DOCUMENTS

| 3,269,633 | 8/1966 | Bernier et al. | 228/36 |
| 3,359,132 | 12/1967 | Wittmann | 427/241 |
| 5,024,366 | 6/1991 | Kim | 228/56.1 |

FOREIGN PATENT DOCUMENTS

| 481710 | 4/1992 | European Pat. Off. | 228/36 |
| 2570220 | 1/1987 | France . | |

*Primary Examiner*—P. Austin Bradley
*Assistant Examiner*—Jeanne M. Elpel
*Attorney, Agent, or Firm*—Larson and Taylor

[57] ABSTRACT

The apparatus is used for processing a microelectronic device having a face with electrically conductive elements arranged thereon. The apparatus comprises a vessel for containing a solder melt, a bowl for drawing molten solder from the vessel, a device holder for holding the microelectronic device with said face directed downwardly, and drive means for moving the bowl and the device holder vertically with respect to each other, thereby allowing said conductive elements to be immersed in molten solder drawn by the bowl. The bowl has an upper rim with an upwardly directed acute angled edge extending therealong.

19 Claims, 3 Drawing Sheets

APPARATUS FOR DEGOLDING OR TINNING CONDUCTIVE PORTIONS OF A MICROELECTRONIC DEVICE

This is a division of application Ser. No. 07/980,160 filed Nov. 23, 1992, now U.S. Pat. No. 5,288,009.

BACKGROUND OF THE INVENTION

1. Field of the Invention

The present invention relates to an apparatus for processing a microelectronic device and in particular to an apparatus for degolding or applying tin solder on electrically conductive elements arranged on a face of the device.

2. Description of the Related Art

In solder processing of electronic parts it is known that pre-tinning before soldering is necessary and that fresh pre-tinning is preferable to the electro-deposition techniques.

In the processing of microelectronic devices such as chip carriers, it is known to remove gold and/or to tin the conductive elements on a device face by dipping said face in a solder melt. Several processes are known for removing excess of tin: shocks or soaking the device in oil, or spinning the device about an axis perpendicular to said face.

The solder melt is at medium temperature recommended by the process and standards (230° C. as an example), and the solder material which is withdrawn by the device cools down rapidly after the separation. Accordingly, in order to achieve a solder deposit of regular thickness on the conductive elements, and to efficiently eliminate the molten solder remaining on the non-conductive portions of the device, it is desired to start the spinning operation as soon as possible after the conductive elements are separated from the melt, i.e. after the meniscus between the device face and the melt breaks. However, the level of the solder melt is not known accurately when a series of devices are processed successively because an amount of solder is withdrawn from the melt by each processed device, so that it is difficult to determine when the spinning operation should be started. It is possible to attach a level sensor to the device holder for detecting the melt level and controlling the spinning operation in response thereto. However the operation of such sensor implies specific signal transmission and processing means and delays the beginning of the spinning step.

SUMMARY OF THE INVENTION

It is therefore an object of the present invention to improve the above-discussed apparatus in order to achieve an accurate and reproducible melt level, so that appropriate control permits the spinning operation to start as early as desired after the separation.

According to the invention, there is provided an apparatus for processing a microelectronic device having a face with electrically conductive elements arranged thereon, comprising a vessel for containing a solder melt, a bowl having a horizontal upper rim for drawing molten solder from the vessel, a device holder for holding the microelectronic device with said face directed downwardly, and drive means for moving the bowl and the device holder vertically with respect to each other, thereby allowing said conductive elements to be immersed in molten solder drawn by the bowl. The upper rim of the bowl has an upwardly directed acute angled edge extending therealong.

Initially, the bowl is completely immersed in the melt. The surface of the liquid is cleaned by sweeping the lighter surface oxides aside. Then the bowl is lifted to a position where at least the upper rim is located above the melt level. The edge along the upper rim promotes the rapid formation of a meniscus between the molten solder and the bowl wall. In addition, it ensures a clean, accurate and reproducible level of molten solder in the bowl. The device face can be immersed in the solder drawn by the bowl, and then separated therefrom. The instant of separation is very well determined due to the accuracy of the solder level. Immediately after separation, the device is spun with a profile of angular acceleration, maximum angular velocity and angular deceleration so selected as to leave the desired solder thickness on the conductive elements. The machine allows the tinning process to be undertaken in gas media (e.g. dry Nitrogen is frequently used).

Other objects, features and advantages of the present invention will become apparent from the following description of a preferred and non-limitative embodiment.

DESCRIPTION OF A PREFERRED EMBODIMENT

Figure 1:
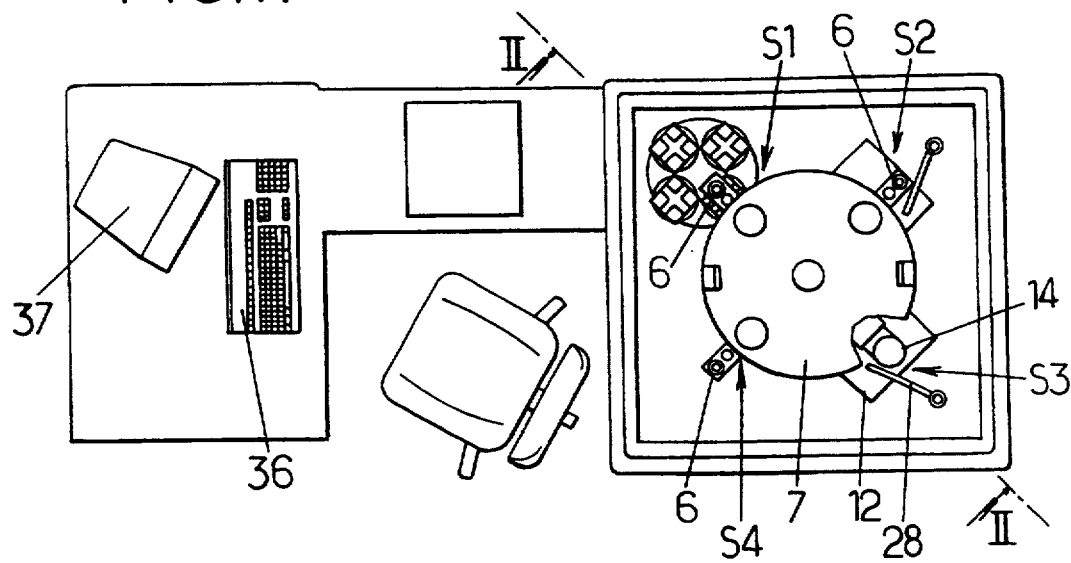
FIG. 1 is a top view of a processing installation which incorporates an apparatus according to the invention.

The installation shown in FIG. 1 is used for applying solder on conductive elements of a microelectronic device. The installation comprises a plurality of stations which may e.g. be disposed in a carousel configuration, i.e. a preheating and loading station S1, a degolding station S2, a tinning station S3, and a cooling and unloading station S4. It will be apparent to those skilled in the art that the installation may comprise other known stations such as a fluxing station.

Figure 3:
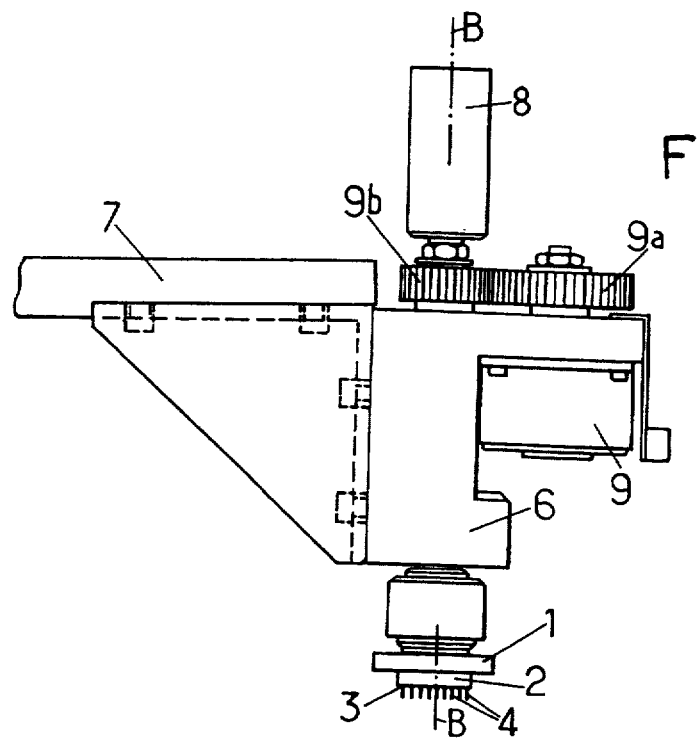
FIG. 3 is an elevation view of a device holder of this apparatus.
Figure 4:
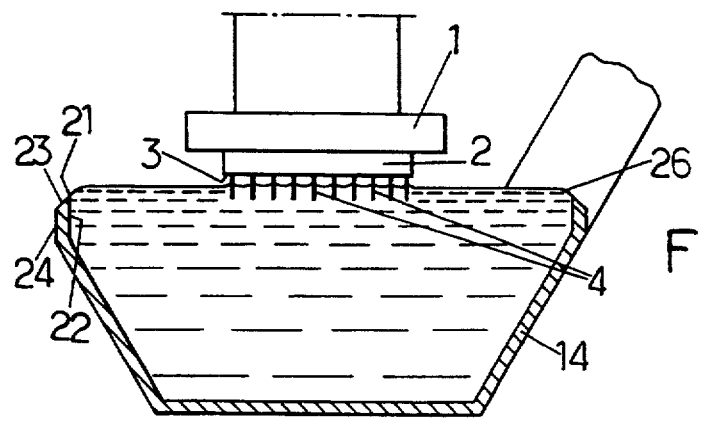
FIGS. 4–6 are schematic views illustrating the immersion of the device in molten solder.

The installation comprises a device holder 1 for holding the microelectronic device 2 and moving it from station to station. The device 2 has a face 3 with conductive elements 4, e.g. contact pins, arranged thereon. As best shown in FIG. 3, the device holder 1 is adapted to hold the device 2 with the face 3 directed downwardly. Various holding modes are suitable, for instance using suction means. In this case, the holder 1 is a nozzle so configured as to match the device shape, thereby ensuring an accurate positioning of the device. Alternative holding modes are by means of adhesives, magnets or electromagnets.

Figure 2:
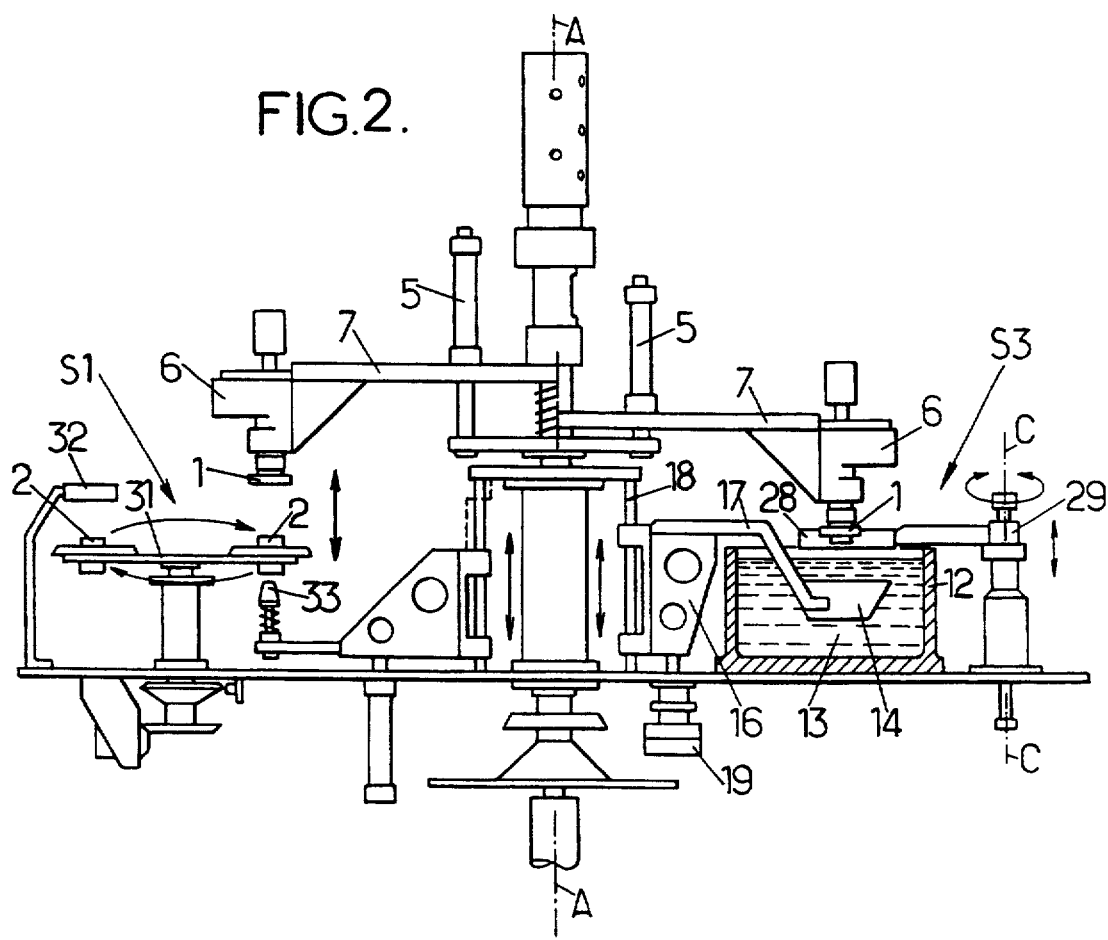
FIG. 2 is a sectional view of the installation of FIG. 1, according to the plane denoted as II—II.

The device holder is mounted on a bracket 6 which is secured to a horizontal support rotatably mounted about the carousel axis A (FIG. 1 and 2). An actuator 5 is connected to support 7 for moving it between an upper position shown in the left-hand portion of FIG. 2 and a lower position shown in the right-hand portion of FIG. 2. As shown in FIG. 3, a first motor 8 is attached to bracket 6 for moving the device holder 1 along a substantially vertical axis B, and a second motor 9 is provided, together with an appropriate transmission 9a, 9b, for rotating the device holder 1 about axis B at a controllable velocity.

The tinning station shown in FIG. 1 and 2 comprises a vessel 12 for containing a Sn—Pb solder melt 13, and a bowl 14 which is slidably mounted along a vertical direction. The bowl 14 is attached to a bracket 16 via an arm 17. The bracket 16 is guided along a vertical rod 18, and connected to an actuator 19 for obtaining the vertical displacement of bowl 14. The vessel 12 is associated with heating means (not shown) for heating the solder material to a selectable temperature higher than its melting point.

The upper rim of bowl 14 extends in a horizontal plane. As shown in FIGS. 4-7, this rim has an upwardly directed edge 21 extending therealong. The edge 21 forms an cute angle of from 15° to 60°. In the illustrative embodiment, this angle is about 45°. The upwardly directed edge 21 is formed at the intersection of the inner surface 22 of the bowl and a tapering surface 23 of the bowl which extends downwardly between said edge 21 and the outer surface 24 of the bowl.

In operation, the device holder 1 is first brought above the loading station S1 in order to grip the microelectronic device which has previously been preheated. Station S1 comprises a horizontal rotating support 31 for supporting devices to be processed. The device 2 is first heated by a radiant element 32, then transferred at the loading place by rotating support 31. There, a vertically sliding push rod 33 gently lifts the device 2 into contact with the device holder 1. A depressurization of about 150 mbar is then applied to the latter for firmly holding the device.

Then the support 7 is rotated to bring the device at the degolding station S2 where it is prepared for the tinning step. Thereafter, the support 7 is further rotated to bring the device above vessel 12 at the tinning station S3, and lowered by actuator 5 to bring the device closer to the solder melt, as shown in the right-hand portion of FIG. 2.

At this moment, bowl 14 is lifted via actuator 19 from a position where it is completely immersed in the solder melt 13 contained in vessel 12, so that at least the upper rim of bowl 14 emerges from the melt. Accordingly, bowl 14 draws an amount of molten solder from vessel 12. The tapered shape of the upper rim of bowl 14 ensures a rapid formation of the meniscus 26 (FIGS. 4-7), and an accurate positioning of the solder level in bowl 14.

Figure 8:
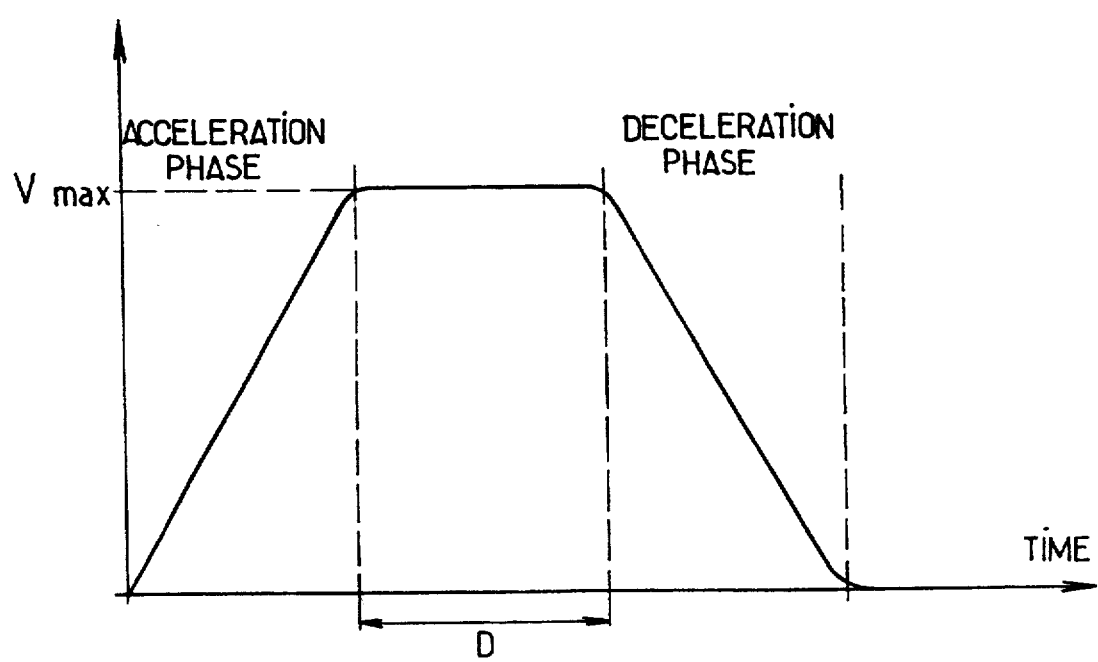
FIG. 8 is a timing diagram which illustrates a spinning step accomplished by the apparatus according to the invention.

The conductive elements 4 of device 2 are immersed into the molten solder drawn by bowl 14. The immersion is performed by moving bowl 14 and device holder 1 vertically with respect to each other via drive means which include either motor 8 for further lowering the device holder or actuator 19 for lifting the bowl, or both. Once the molten solder has spread over the conductive elements 4 (FIG. 4), the device holder 1 is lifted (and/or the bowl is lowered; see FIG. 5) up to a position where the conductive elements 4 are separated from the molten solder (FIG. 6). As soon as the latter position is reached, motor 9 is energized to cause device 1 to spin about axis B. The rotational velocity profile, i.e. the values of the angular acceleration, maximum angular velocity and angular deceleration, is so adjusted as to obtain the desired solder thickness on elements 4 and eliminate the undesired solder on non-conductive portions of the device. Such a profile is illustrated in FIG. 8. The acceleration value (i.e. the slope of the curve in the acceleration phase), the maximum velocity $V_{max}$, the duration D of the spinning at $V_{max}$, and the deceleration value (i.e. the slope of the curve in the deceleration phase) are selected by the operator depending on the nature of the conductive elements, the characteristics of the solder (composition, temperature . . . ), the desired solder thickness . . . . As shown in FIG. 1, the installation comprises a keyboard 36 for entering these parameters and a computer 37 to derive the rotational velocity profile therefrom and to control motor 9 accordingly. Typical values of the maximum angular velocity $V_{max}$ are between 1 000 and 16 000 rpm, the angular acceleration and deceleration being from 1 to 300 rounds per square second.

The relative positions of device holder 1 and bowl 14 when the device is separated from the molten solder are well determined owing to the accurate positioning of the solder level in bowl 14 which results from the shape of its upper rim. Accordingly, appropriate control of motors 8, 9 and actuator 19 makes it possible to start the spinning operation as soon as desired after the separation without requiring a special level sensor and the associated signal processing.

Subsequently, the support 7 is further rotated to bring the device at the cooling and unloading station S4 where it becomes available for further processing.

Figure 5:
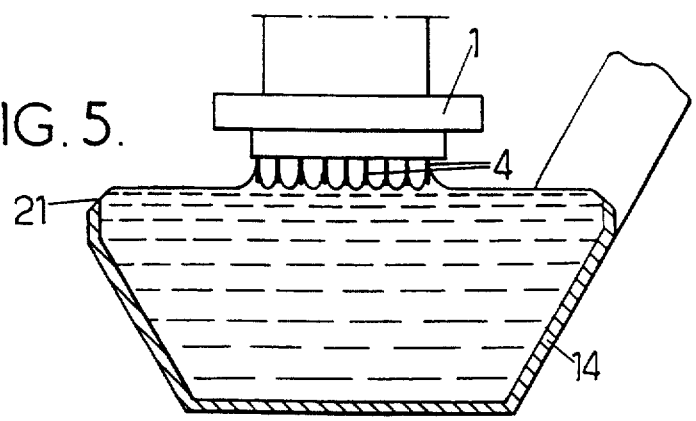
Figure 6:
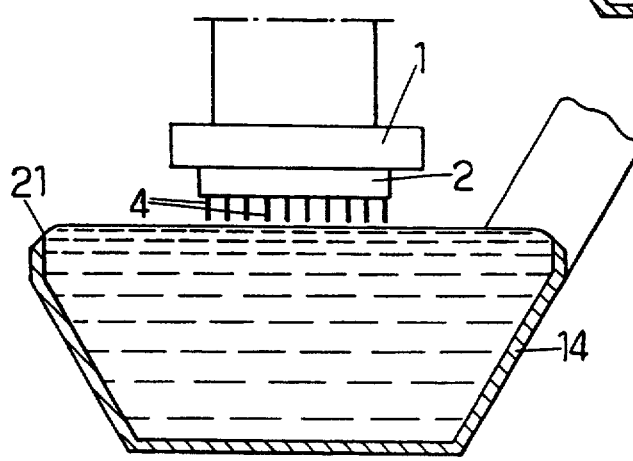
Figure 7:
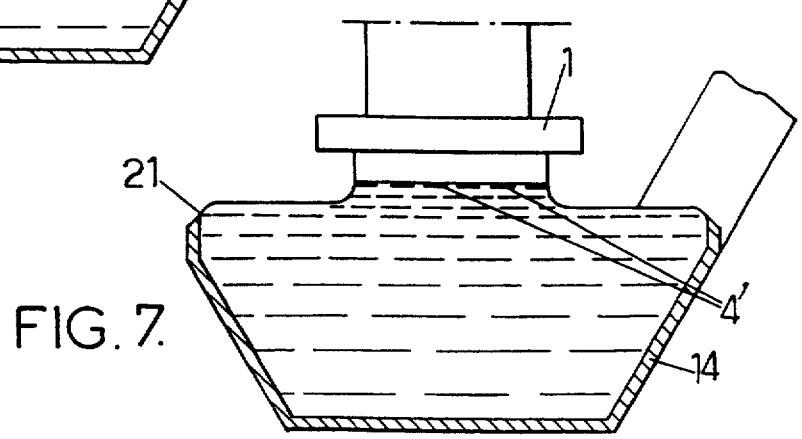
FIG. 7 is a view similar to FIG. 5 in the case of another type of microelectronic device.

FIG. 7 is a view similar to FIG. 5 in the case where the conductive elements of the device are metallized pads 4' instead of contact pins 4. In this case, the separation of the conductive elements from the molten solder (i.e. the break of the meniscus 27 between the solder surface and the lower face of the device) may occur when the device holder 1 is at a different height with respect to the bowl 14. Accordingly, it will be useful to consider the type of microelectronic device to be processed when determining the timing of the spinning operation.

As shown in FIG. 2, the tinning station S3 also includes a horizontal blade scraper 28 which is fixed on a rotatable support 29. When the support 29 is rotated about a vertical axis C, the blade scraper 28 slides along the surface of the solder melt 13 contained in vessel 12. This sweeps a top layer of the solder melt 13 away from a surface region located above bowl 14 when the latter is completely immersed in the melt 13. This sweeping movement is performed before bowl 14 is lifted by actuator 19, in order to remove tin oxide which may otherwise be drawn by the bowl together with the underlying solder.

The degolding station S2 may be used, if necessary, for removing a gold film which is provided on the conductive elements of some microelectronic devices for protective purposes. In such circumstances, it is desired to remove the gold film before the tinning step because gold and tin are known to form a compound which is detrimental to the quality of subsequent solderings. The "degolding" step may be effected before the tinning step by means of station S2 which is identical to the tinning station S3. The device is dipped into a solder melt, separated therefrom and then spun. The spinning step is similar, with a different choice of angular acceleration, rotating velocity, duration and angular deceleration, in order to virtually eliminate the solder containing traces of gold. The next station is the tinning station S3 where the device is processed as described hereinbefore.

As shown in the top view of FIG. 1, the support 7 preferably carries a plurality of brackets 6 and device holders, whereby the processing rate can be enhanced. In the exemplary embodiment, four brackets 6 are provided on the carousel support 7 (one of which is not shown in FIG. 1 for exposing vessel 12 and bowl 14 at the tinning station S3), at regular intervals so that the four device holders can stay simultaneously at a respective station.

The invention has been disclosed with reference to a preferred embodiment. However, it will be readily apparent for those skilled in the related art that many alternative features may be contemplated without departing from the spirit and scope of the invention.

What is claimed is:

1. An apparatus for processing a microelectronic device having a face with electrically conductive elements arranged thereon, comprising a vessel for containing a solder melt, a bowl for drawing molten solder from the vessel, a device holder for holding the microelectronic device with said face directed downwardly, and drive means for moving the bowl and the device holder vertically with respect to each other, thereby allowing said conductive elements to be immersed in molten solder drawn by the bowl, wherein the bowl has an upper rim which extends in a horizontal plane, said upper rim being formed by an upwardly directed edge extending therealong, said upwardly directed edge forming an acute angle of from 15° to 60°.

2. The apparatus of claim 1, further comprising a blade scraper capable of sliding along the surface of the solder melt contained in the vessel for moving a top layer of said molten solder away from a surface region located above the bowl when the bowl is completely immersed in the solder melt contained in the vessel.

3. The apparatus of claim 1, further comprising means for causing the device holder to spin about a substantially vertical axis with a first phase of submitting the device holder to a selected angular acceleration, a second phase, having a selected duration, of spinning the device holder at a selected maximum rotational velocity, and a third phase of submitting the device holder to a selected angular deceleration.

4. The apparatus of claim 3, wherein said maximum rotational velocity is from 1 000 to 16 000 rpm.

5. The apparatus of claim 3, wherein said angular acceleration and deceleration are from 1 to 300 rounds per square second.

6. Apparatus according to claim 1 wherein said upwardly directed edge comprises a surface tapering downwardly from said edge to a surface of said bowl.

7. Apparatus according to claim 6 wherein said surface of said bowl is the outer surface of said bowl.

8. Apparatus according to claim 7 wherein said edge is formed at the intersection of the inner surface of said bowl and said downwardly tapering surface.

9. An apparatus for processing a microelectronic device having a face with electrically conductive elements arranged thereon, comprising a vessel for containing a solder melt, a bowl for drawing molten solder from the vessel, a device holder for holding the microelectronic device with said face directed downwardly, and drive means for moving the bowl and the device holder vertically with respect to each other, thereby allowing said conductive elements to be immersed in molten solder drawn by the bowl, wherein the bowl has an upper rim which extends in a horizontal plane, said upper rim being formed by an upwardly directed edge extending therealong, said upwardly directed edge comprising a surface tapering downwardly from said edge to a surface of said bowl.

10. Apparatus according to claim 9 wherein said surface of said bowl is the outer surface of said bowl.

11. Apparatus according to claim 10 wherein said edge is formed by at the intersection of the inner surface of said bowl and said downwardly tapering surface.

12. The apparatus of claim 9, further comprising a blade scraper capable of sliding along the surface of the solder melt contained in the vessel for moving a top layer of said molten solder away from a surface region located above the bowl when the bowl is completely immersed in the solder melt contained in the vessel.

13. The apparatus of claim 9, further comprising means for causing the device holder to spin about a substantially vertical axis with a first phase of submitting the device holder to a selected angular acceleration, a second phase, having a selected duration, of spinning the device holder at a selected maximum rotational velocity, and a third phase of submitting the device holder to a selected angular deceleration.

14. The apparatus of claim 13, wherein said maximum rotational velocity is from 1,000 to 16,000 rpm.

15. The apparatus of claim 13, wherein said angular acceleration and deceleration are from 1 to 300 revolutions per square second.

16. An apparatus for processing a microelectronic device having a face with electrically conductive elements arranged thereon, comprising a vessel for containing a solder melt, a bowl for drawing molten solder from the vessel, a device holder for holding the microelectronic device with said face directed downwardly, drive means for moving the bowl and the device holder vertically with respect to each other, thereby allowing said conductive elements to be immersed in molten solder drawn by the bowl, and means for causing the device holder to spin about a substantially vertical axis with a first phase of submitting the device holder to a selected angular acceleration, a second phase, having a selected duration, of spinning the device holder at a selected maximum rotational velocity, and a third phase of submitting the device holder to a selected angular deceleration, wherein the bowl has an upper rim which extends in a horizontal plane, said upper rim being formed by an upwardly directed edge extending therealong.

17. The apparatus of claim 16, further comprising a blade scraper capable of sliding along the surface of the solder melt contained in the vessel for moving a top layer of said molten solder away from a surface region located above the bowl when the bowl is completely immersed in the solder melt contained in the vessel.

18. The apparatus of claim 16, wherein said maximum rotational velocity is from 1,000 to 16,000 rpm.

19. The apparatus of claim 16, wherein said angular acceleration and deceleration are from 1 to 300 revolutions per square second.

* * * * *